US 7,064,958 B2

(12) United States Patent
Chen et al.

(10) Patent No.: US 7,064,958 B2
(45) Date of Patent: *Jun. 20, 2006

(54) MOUNTING APPARATUS FOR MOTHERBOARDS

(75) Inventors: Yun-Lung Chen, Tu-Cheng (TW); Hui Li, Shenzhen (CN)

(73) Assignee: Hon Hai Precision Industry Co., LTD, Tu-cheng (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/990,068

(22) Filed: Nov. 16, 2004

(65) Prior Publication Data

US 2005/0146846 A1    Jul. 7, 2005

(30) Foreign Application Priority Data

Jan. 2, 2004    (TW) .............................. 93200031 U

(51) Int. Cl.
G06F 1/16    (2006.01)
H05K 5/00    (2006.01)

(52) U.S. Cl. ...................... 361/726; 361/756; 361/740; 361/748; 211/41.12; 312/223.1

(58) Field of Classification Search ................. 29/450; 710/305; 361/756, 732, 740–741, 747–748, 361/801–802, 679–687, 724–727; 211/41.12, 211/41.17; 312/223.1–223.2
See application file for complete search history.

(56) References Cited

U.S. PATENT DOCUMENTS

| 5,490,036 | A  | * | 2/1996  | Lin et al. ..................... 361/680 |
| 6,470,555 | B1 |   | 10/2002 | Boe ............................ 29/450 |
| 6,778,381 | B1 | * | 8/2004  | Bolognia et al. ........... 361/681 |
| 6,937,476 | B1 | * | 8/2005  | Chen et al. ................. 361/756 |
| 2004/0225816 | A1 | * | 11/2004 | Leigh et al. ................ 710/305 |

* cited by examiner

Primary Examiner—Hung Van Duong
(74) Attorney, Agent, or Firm—Morris, Manning & Martin; Tim Tingkang Xia, Esq.

(57) ABSTRACT

A mounting apparatus for mounting a planar member (10) comprises a base (200), a pair of locking members (160) secured on the base, a supporting tray (130) secured on a bottom of the planar member and an operating shaft (110) pivotally attached to the supporting tray. A plurality of mounting holes (143) is defined in the supporting tray and each comprises an accommodating hole (142) and a retaining hole (144). A plurality of standoffs (210) formed on the base and each comprises a head portion (214) and a neck portion (212). A pair of arms is formed on the operating shaft and each defines a cutout for receiving the locking member. After the head portions of the standoffs are received in corresponding accommodating holes, the operating shaft is pushed towards the base. The planar member is attached to the base when the neck portions are received in corresponding retaining holes.

20 Claims, 4 Drawing Sheets

MOUNTING APPARATUS FOR MOTHERBOARDS

CROSS-REFERENCE TO RELATED APPLICATIONS

Relevant subject matter is disclosed in co-pending U.S. Patent Applications entitled "MOUNTING APPARATUS FOR MOTHERBOARDS" with application Ser. No. 10/989,701 filed on Nov. 16, 2004, assigned to the same assignee with this application.

BACKGROUND OF THE INVENTION

1. Field of the Invention

The present invention relates to mounting apparatuses, and particularly to a mounting apparatus that readily attach a motherboard in a computer chassis.

2. Description of the Related Art

Conventional methods of installing a circuit board, such as a motherboard, to a computer chassis use small fasteners such as screws or rivets. When using such objects to mount a motherboard to a computer chassis, an appropriate tool must be used, e.g., a screwdriver or riveter. Using tools to connect these components may damage the motherboard, if the tool slips during the assembly process. Additionally, the process of mounting the motherboard to the chassis may require working in tight space or require the use of smaller hardware and tools, which can make the assembly process difficult. Thus, these motherboard installation methods are unduly laborious and time-consuming.

An improvement in the mounting of a motherboard in a computer chassis is illustrated and described in U.S. Pat. No. 6,470,555. In this patent, a method of removably mounting a motherboard is disclosed. The method comprises positioning a first fastener of a mounting device adjacent to a mounting slot in the chassis, inserting the first fastener of the mounting device through the mounting slot in the chassis, releasing the mounting device so that the first fastener clamps onto the chassis through the mounting slot, positioning a second fastener of the mounting device adjacent a mounting hole on the motherboard, and inserting the second fastener of the mounting device into the mounting hole until the second fastener clasps the motherboard through the mounting hole.

However, the motherboard is directly assembled to and disassembled from the chassis when using the above method. The operating space for mounting the motherboard is limited, so components on the motherboard or in the chassis adjoining the motherboard can be damaged.

Thus an improved mounting apparatus for motherboards that overcomes the above-mentioned problems is desired.

SUMMARY OF THE INVENTION

Accordingly, an object of the present invention is to provide a mounting apparatus comprising a locking member, the locking member readily and conveniently secures a planar member, for example, a motherboard, to the computer base and allows ready detachment therefrom.

To achieve the above-mentioned object, a mounting apparatus for mounting a planar member defining a plurality of first mounting holes comprises a base, a pair of locking members secured on the base, a supporting tray secured on a bottom surface of the planar member and an operating shaft pivotally attached to the supporting tray. The first mounting holes each comprise a first accommodating hole and a first retaining hole. A plurality of second mounting holes is defined in the supporting tray. Each second mounting hole comprises a second accommodating hole and a second retaining hole. A plurality of standoffs formed on the base corresponding to the first and second mounting holes respectively and each comprises a head portion and a neck portion. A pair of supporting pieces is bent upwardly from opposite ends of a front portion of the supporting tray. The operating shaft comprises a pair of arms pivotally attached to the supporting tray on the supporting pieces. The arms each define a cutout in a bottom portion. After the head portions of the standoffs on the base are received in corresponding first and second accommodating holes, the operating shaft is pushed towards an inner space of the base. The planar member is attached to the base when the neck portions of the standoffs are received in corresponding first and second retaining holes.

Other objects, advantages and novel features of the present invention will be drawn from the following detailed description of a preferred embodiment of the present invention with attached drawings, in which:

DETAILED DESCRIPTION OF THE INVENTION

Figure 1:
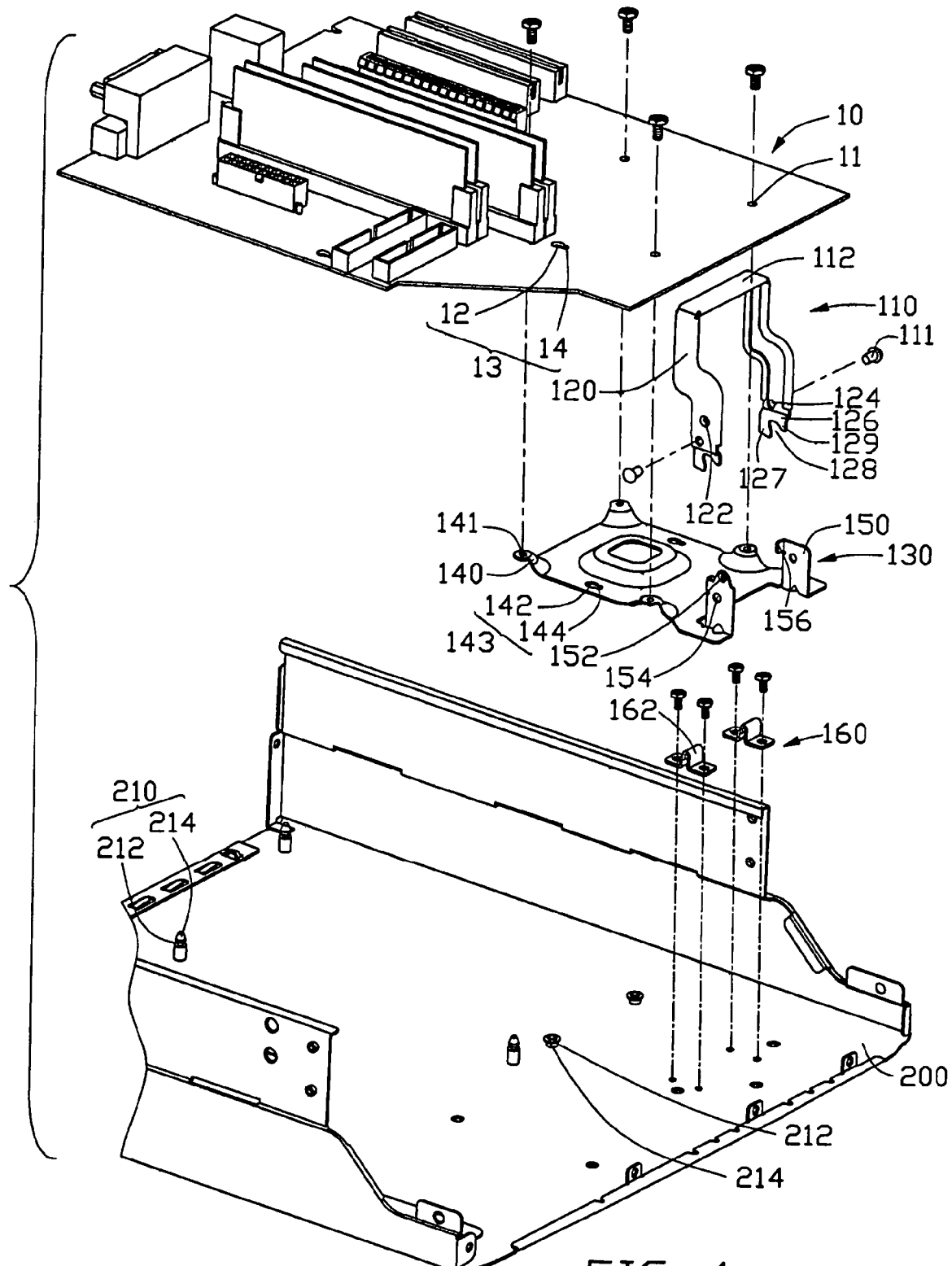
FIG. 1 is an exploded, isometric view of a mounting apparatus in accordance with a preferred embodiment of the present invention together with a motherboard, the mounting apparatus comprising a base, a locking member, a supporting tray and an operating shaft.

Referring to FIG. 1, a mounting apparatus in accordance with the preferred embodiment of the present invention is used to assemble and disassemble a first planar member such as a motherboard 10 on a second planar member such as a computer base. The mounting apparatus comprises a U-shaped operating shaft 110, a supporting tray 130, a pair of locking members 160, and a base 200.

The motherboard 10 defines a plurality of first mounting holes 13 and four fixing holes 11 therein. Each mounting hole 13 is generally calabash-shaped and comprises a first accommodating hole 12 and a first retaining hole 14.

The operating shaft 110, which is pivotally attached to the supporting tray 130, comprises a handle portion 112 and a pair of arms 120 extended downwardly from opposite ends of the handle portion 112 respectively. A concave 122 is defined in a lower portion of one of the arms 120 at an outer side thereof. A pivot hole 124 is defined in each arm 120 below the concave 122. A bent piece 126 is bent inwardly from a bottom end of each arm 120 and then bent downwardly so as to parallel to the arm 120. A cutout 128 is defined in each bending piece 126 thereby forming a first pressing portion 127 and a second pressing portion 129.

The supporting tray 130 is removably attached to the base 200 and secured on a bottom surface of the motherboard 10. The supporting tray 130 is integrally formed from a rectangular planar panel. Two pairs of platforms 140 are symmetrically projected from the supporting tray 130. A fixing hole 141 is defined in each platform 140 corresponding to the fixing hole 11 of the motherboard 10. Four screws (not labeled) are used to cooperate with the fixing holes 11, 141 to secure the motherboard 10 to the supporting tray 130. Two supporting pieces 150 are bent upwardly from opposite corner ends of a front portion of the supporting tray 130. A convex 152 is formed on an inside surface of one of the supporting pieces 150 corresponding to the concave 122 of the operating shaft 110. Each supporting piece 150 defines a pivot hole 154 corresponding to the pivot hole 124 of the operating shaft 110. A stopping piece 156 is bent inwardly from a top portion of the supporting piece 150 from an inner edge thereof, for preventing the operating shaft 110 from being excessively rotated. A plurality of second mounting holes 143 is defined in the supporting tray 130. Each second mounting hole 143 is generally calabash-shaped and comprises a second accommodating hole 142 and a second retaining hole 144.

The locking member 160 with a generally n-shaped main body 162 is secured on the base 200 using screw-securing manners. Alternatively, the locking member 160 can be a cylindrical protrusion. The locking member 160 can also be integrated with the base 200 if desired.

A plurality of standoffs 210 is formed on the base 200 to cooperate with the first and second mounting holes 13, 143. Each standoff 210 comprises a head portion 214 and a neck portion 212. A diameter of the head portion 212 is smaller than that of the first and second accommodating holes 12, 142 of the mounting holes 13, 143, and is greater than that of the first and second retaining holes 14, 144 of the mounting holes 13, 143. A diameter of the neck portion 214 is smaller than that of the first and second retaining holes 14, 144 of the mounting holes 13, 143.

Figure 2:
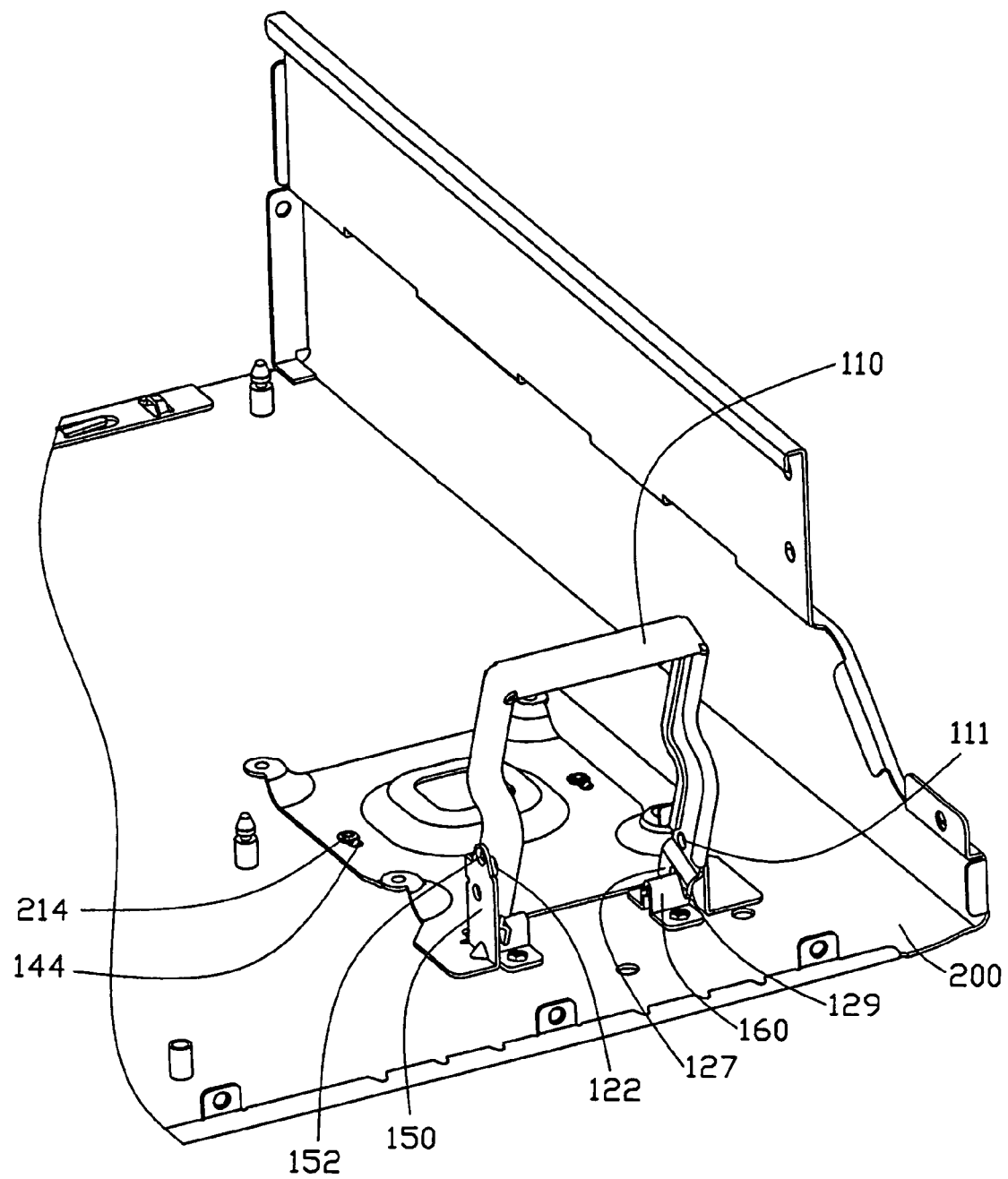
FIG. 2 is a partly assembled view of the mounting apparatus of FIG. 1.
Figure 3:
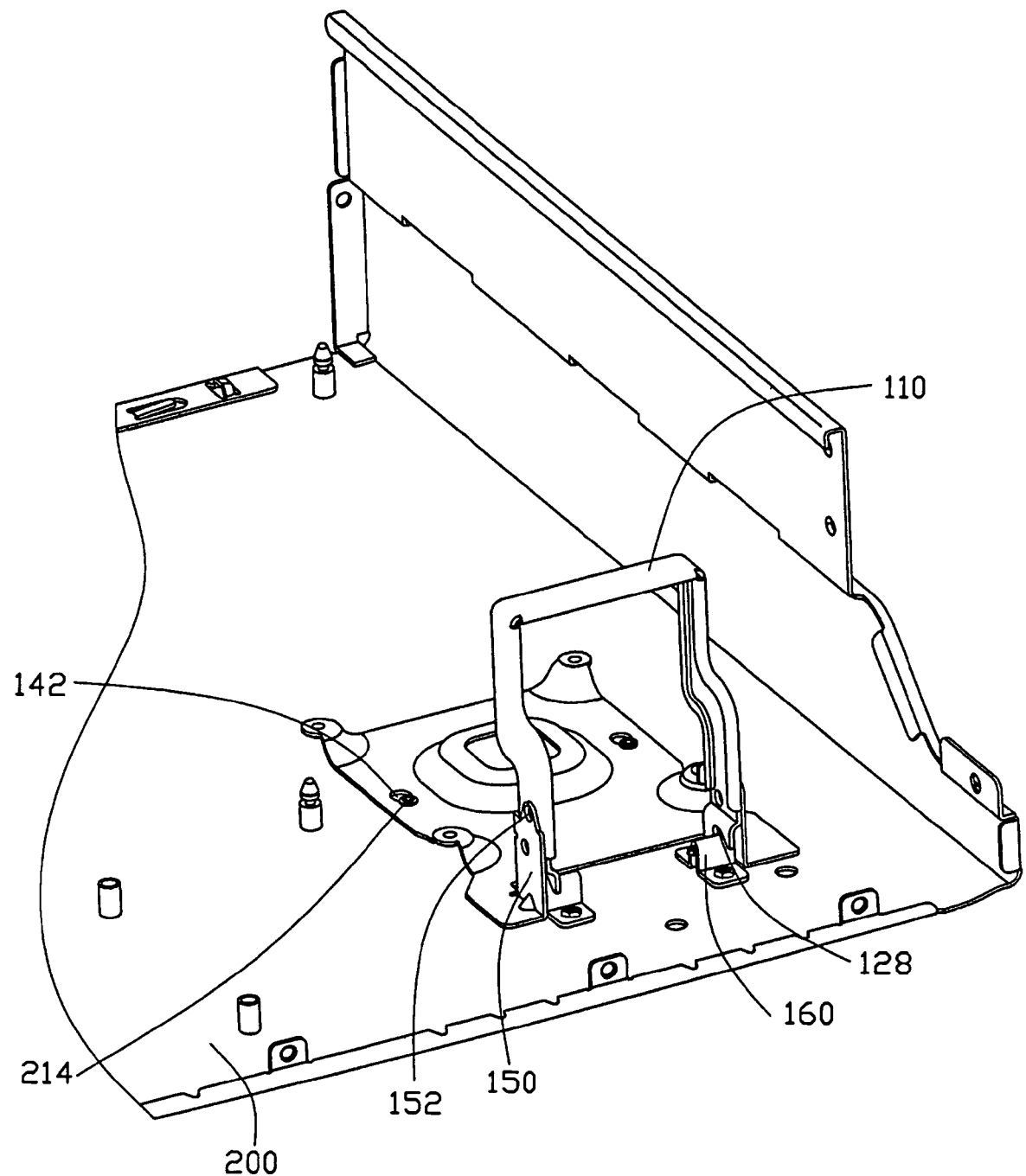
FIG. 3 is a fully assembled view of the mounting apparatus of FIG. 1.
Figure 4:
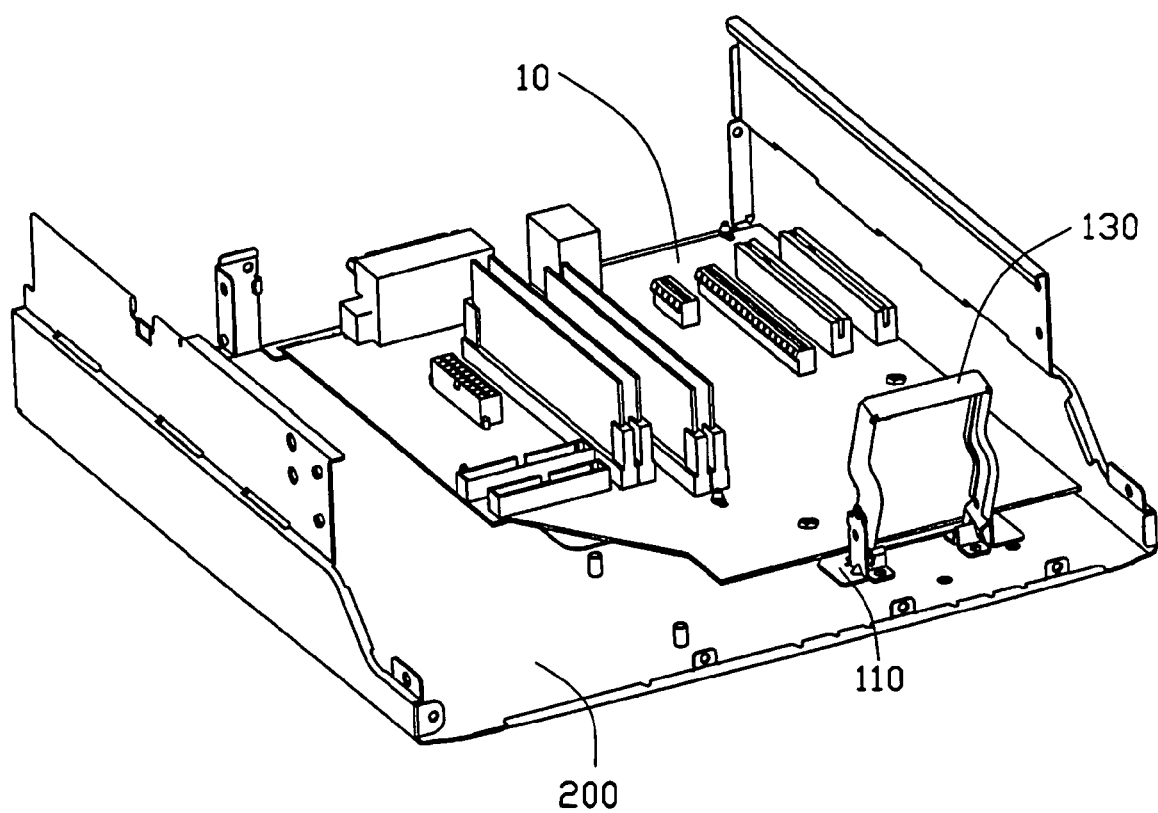
FIG. 4 is a fully assembled view of FIG. 1.

Referring also to FIGS. 2 to 4, in assembly, the locking members 160 are firstly secured on the base 200, then the supporting tray 130 and the operating shaft 110 are assembled together. Thereafter the supporting tray 130 is put on the base 200 after that the motherboard 10 is secured thereon. The steps of assembly and disassembly will be described in detail below.

When assembling the operating shaft 110 and the supporting tray 130 together, a pair of rivets 111 is used to cooperate with the pivot holes 124, 154 to pivotally mount the operating shaft 110 to the supporting tray 130. The operating shaft 110 is thus positioned between the supporting pieces 150 of the supporting tray 130. Then the motherboard 10 is secured on the supporting tray 130. After that, the supporting tray 130 with the motherboard 10 mounted thereon is put on the base 200 with the standoffs 210 extending through the first and second accommodating holes 12, 142 of the mounting holes 13, 143, respectively. At the time, the main bodies 162 of the locking members 160 are engaged in corresponding cutouts 128 of the operating shaft 110, so that the operating shaft 110 can pivot around the rivets 111. The handle portion 112 of the operating shaft 110 is then pushed towards inner space of the base 200, and the first pressing portions 127 begin to press the main bodies 162. Continually pushing the handle portion 112, the supporting tray 130 is driven by the operating shaft 110 to gently move to the inner space of the base 200. The supporting tray 130 stops moving when the neck portions 212 of the standoffs 210 substantially engaged in corresponding first and second retaining holes 14, 144 of the mounting holes 13, 143 of the motherboard 10 and the supporting tray 130. At the time, the convex 152 of the supporting piece 150 of the supporting tray 130 is engaged in the concave 122 of the operating shaft 110, for positioning the operating shaft 110 to maintain its upstanding state.

In disassembly, the handle portion 112 is pulled towards an outer space of the base 200. As a result, the second pressing portions 129 begin to press the main bodies 162 of the locking member 160. Continually pulling the handle portion 112, the supporting tray 130 is driven by the operating shaft 110 to move towards the outer space of the base 200. The supporting tray 130 is stopped when the first and second accommodating holes 12, 142 move to the positions where the standoffs 210 are located. At the time, an operator can lift the supporting tray 130 so as to disassemble the motherboard 10 from the base 200.

While the present invention has been illustrated by the description of the preferred embodiment thereof, and while the preferred embodiment has been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

What is claimed is:

1. A mounting apparatus for mounting a planar member defining a plurality of first mounting holes, the first mounting holes each comprising a first accommodating hole and a first retaining hole, the mounting apparatus comprising:
   a base with a plurality of first standoffs formed thereon, the first standoffs received in corresponding first mounting holes respectively and each comprising a first head portion and a first neck portion;
   a pair of locking members secured on the base;
   a supporting tray adapted for being secured to a bottom surface of the planar member with a pair of supporting pieces bent upwardly from opposite ends of a front portion thereof; and
   an operating shaft comprising a pair of arms pivotally attached to the supporting tray on the supporting pieces, the arms each defining a cutout in a bottom portion;
   wherein after the first head portions of the first standoffs on the base are received in corresponding first accommodating holes of the planar member, the operating shaft is pushed towards an inner space of the base, the planar member is attached to the base when the first neck portions of the first standoffs are received in corresponding first retaining holes of the planar member.

2. The mounting apparatus as described in claim 1, wherein a plurality of first locking holes are defined in the planar member, and corresponding numbers of second locking holes are defined in the supporting tray.

3. The mounting apparatus as described in claim 1, wherein a first pivot hole is defined in each of the arms of the operating shaft in a lower portion, and a second pivot hole is defined in each of the supporting pieces corresponding to the first pivot.

4. The mounting apparatus as described in claim 1, wherein a concave is defined in a lower portion of one of the arms in an outer side thereof, and a convex is formed in an inner side of one of the supporting pieces for receiving the concave.

5. The mounting apparatus as described in claim 1, wherein a bending piece is bent inwardly from a bottom end of each of the arms and parallel to the arms, and the cutout is defined in the bending piece.

6. The mounting apparatus as described in claim 1, wherein a plurality of second mounting holes is defined in the supporting tray and each comprises an second accommodating hole and a second retaining hole, and corresponding number of second standoffs are formed on the base, each of the second standoffs comprises a second head portion and a second neck portion.

7. The mounting apparatus as described in claim 1, wherein the operating shaft further comprises a handle portion integrated with the arms and connects the arms together.

8. The mounting apparatus as described in claim 2, wherein a plurality of platforms is symmetrically projected from the supporting tray, the second locking holes are symmetrically defined in the platforms respectively.

9. The mounting apparatus as described in claim 6, wherein a diameter of the first or second head portion is smaller than that of the first or second accommodating holes respectively, and is greater than that of the first or second retaining holes, and a diameter of the first or second neck portion is smaller than that of the first or second retaining hole respectively.

10. A mounting apparatus for mounting a planar member comprising:
   a base with a plurality of standoffs formed thereon, the standoffs each comprising a head portion and a neck portion;
   at least one locking member secured on the base;
   a supporting tray secured on a bottom surface of the planar member with a pair of supporting pieces bending upwardly from opposite ends of a front portion thereof, and a plurality of mounting holes defined in the supporting tray to receive the standoffs of the base, the mounting holes each comprise an accommodating hole and a retaining hole; and
   an operating shaft comprising a pair of arms pivotally attached to the supporting tray on the supporting pieces, the arms each forming a first pressing portion and a second portion on a bottom portion thereof;
   wherein after the head portions of the standoffs of the base are received in corresponding accommodating holes of the supporting tray and the first and second pressing portions press opposite sides of the locking member respectively, the operating shaft is pushed towards an inner space of the base, the planar member is attached to the base when the neck portions of the standoffs are received in corresponding retaining holes.

11. The mounting apparatus as described in claim 10, wherein a plurality of first locking holes are defined in the planar member, and corresponding numbers of second locking holes are defined in the supporting tray.

12. The mounting apparatus as described in claim 10, wherein a first pivot hole is defined in each of the arms of the operating shaft in a lower portion, and a second pivot hole is defined in each of the supporting pieces corresponding to the first pivot hole.

13. The mounting apparatus as described in claim 10, wherein a concave is defined in a lower portion of one of the arms in an outer side thereof, and a convex is formed in an inner side of one of the supporting pieces for receiving the concave.

14. The mounting apparatus as described in claim 10, a bending piece is bent inwardly from a bottom end of each arm and parallel to the arm, and the first and second pressing portion are formed on the bending piece.

15. The mounting apparatus as described in claim 10, wherein the operating shaft further comprises a handle portion to connect the arms together.

16. The mounting apparatus as described in claim 10, wherein a diameter of the head portion is smaller than that of the accommodating holes, and is greater than that of the retaining holes, and a diameter of the neck portion is smaller than that of the retaining hole.

17. The mounting apparatus as described in claim 11, wherein a plurality of platforms is symmetrically projected from the supporting tray, the second locking holes are symmetrically defined in the platforms respectively.

18. In combination:
   a computer base;
   a motherboard;
   a tray horizontally movable in the computer base with the motherboard supported thereof;
   at least one locking member immovably disposed in the computer base adjacent to the tray;
   an operating shaft pivotally attached to the tray with at least one free end straddling on said at least one locking member; and
   means for securing the motherboard in the computer base in a fixed position;
   wherein said free end of the operating shaft drives the motherboard and the tray to horizontally move between the fixed position and a released position.

19. The combination as described in claim 18, wherein the securing means comprises a plurality of standoffs formed in the computer base, and a plurality of mounting holes defined in at least one of the tray and the motherboard.

20. The combination as described in claim 18, wherein said free end of the operating shaft comprises first and second pressing portions and a cutout defined between first and second pressing portions.

\* \* \* \* \*